(12) United States Patent
Anikitchev et al.

(10) Patent No.: US 7,139,300 B2
(45) Date of Patent: Nov. 21, 2006

(54) WIDE-STRIPE SINGLE-MODE DIODE-LASER

(75) Inventors: Serguei G. Anikitchev, Belmont, CA (US); Andrea Caprara, Menlo Park, CA (US)

(73) Assignee: Coherent, Inc., Santa Clara, CA (US)

( * ) Notice: Subject to any disclaimer, the term of this patent is extended or adjusted under 35 U.S.C. 154(b) by 237 days.

(21) Appl. No.: 10/643,621

(22) Filed: Aug. 19, 2003

(65) Prior Publication Data
US 2005/0041709 A1  Feb. 24, 2005

(51) Int. Cl.
*H01S 5/00* (2006.01)
(52) U.S. Cl. .................. 372/50.23; 372/46.016
(58) Field of Classification Search .................. 372/44, 372/46, 50.23, 46.015, 46.016
See application file for complete search history.

(56) References Cited

U.S. PATENT DOCUMENTS

| | | | |
|---|---|---|---|
| 4,796,269 A * | 1/1989 | DeFreez et al. ....... 372/50.123 |
| 4,815,054 A * | 3/1989 | Strasser ...................... 368/319 |
| 4,872,175 A * | 10/1989 | Nakatsuka et al. ........... 372/46 |
| 5,084,895 A * | 1/1992 | Shimada et al. ......... 372/50.23 |
| 5,457,569 A | 10/1995 | Liou et al. ................... 359/344 |
| RE37,354 E * | 9/2001 | Welch et al. ................. 372/50 |
| 6,307,873 B1 * | 10/2001 | Geels et al. ............. 372/46.01 |
| 6,430,204 B1 * | 8/2002 | Tanaka ......................... 372/46 |
| 6,744,797 B1 * | 6/2004 | Kuniyasu et al. ............. 372/43 |

* cited by examiner

*Primary Examiner*—Minsun Oh Harvey
*Assistant Examiner*—Tod T. Van Roy
(74) *Attorney, Agent, or Firm*—Stallman & Pollock LLP

(57) ABSTRACT

A wide-stripe diode-laser includes a lower cladding region, a lower waveguide region, an active region, an upper waveguide region, and an upper cladding region all comprising semiconductor layers epitaxially grown on a semiconductor substrate. An elongated rectangular electrode on the upper cladding layer defines a stripe or pumped section. Adjacent the electrode is an unpumped section in which at least the quantum-well layer has been treated to cause the active region to be disordered. In this unpumped section, at least one area of the area is etched to a depth equal to or less than the thickness of the cladding region. The etched area provides a diverging lens effect in the waveguide region. The diverging lens effect expands the fundamental mode of the laser in the stripe to a width sufficient to improve single mode performance.

23 Claims, 12 Drawing Sheets

WIDE-STRIPE SINGLE-MODE DIODE-LASER

TECHNICAL FIELD OF THE INVENTION

The present invention relates generally to edge-emitting diode-lasers. The invention relates in particular to a wide-stripe diode-laser configured to operate in a single transverse mode.

DISCUSSION OF BACKGROUND ART

Referring now to the drawings, wherein like features are designated by like reference numerals, FIG. 1 schematically illustrates one common type of prior-art, edge-emitting, separate-confinement-heterostructure, diode-laser 20 formed by epitaxially growing a series of semiconductor layers on an n-doped, semiconductor substrate 22. A lower electrical confinement or cladding region 24 of the diode-laser includes one or more n-doped semiconductor layers. Surmounting the lower cladding region is a lower optical confinement or waveguide region 26, formed by one or more undoped semiconductor layers. Surmounting the lower waveguide region is a so-called active region 28 including at least one undoped, active or quantum-well layer. If there is more than one quantum well layer, the quantum-well layers are separated by barrier layers (not shown). The active region is surmounted by an upper waveguide region 30, similar to lower waveguide region 24. Upper waveguide region 30 is surmounted in turn by an upper cladding region 32 including at least one p-doped semiconductor layer.

Typical Layer or Region Thickness

An elongated, rectangular electrode 34 is bonded to upper cladding region 32. Electrode 34 extends the entire length (L) of the diode-laser. The width W and length L of the electrode define the width of the diode-laser. The electrode and the region under the electrode are often referred to by practitioners of the art to as a "stripe".

The diode-laser is energized (electrically pumped) by passing current through the layers between electrode 34 and substrate 22. Mirrors (not shown) on the ends (facets) of the laser form a laser resonant cavity. Energizing the laser generates electrical carriers that recombine in the active region to provide laser radiation that circulates in the resonant cavity. Laser radiation is emitted from the diode-laser in a general direction along a longitudinal (Z) axis of the laser. The radiation is emitted as a diverging beam (not shown) having a greater divergence in the Y-axis than in the X-axis. For this reason the Y-axis and X-axis are respectively referred to as the fast and slow axes by practitioners of the art.

Laser radiation circulating in the laser cavity is confined in the thickness (Y-axis) direction of the layers by reflection from interfaces between the waveguide regions and the cladding regions adjacent thereto. The circulating radiation is confined in the width (X-axis) direction, among other factors, by the width of the electrode, as it is only in this width that there is optical gain.

This type of diode-laser typically has a stripe-length between about 1.0 and 1.5 millimeters (mm), and emits radiation from an emitting aperture having a height H of about 1.0 micrometer (μm) and a width W between about 4.0 and 200 μm. The emitting aperture height H includes the combined thickness of the upper and lower waveguide regions 30 and 26 and the active region 28. Width W is usually referred to in the art as the emitter-width or stripe-width. A diode-laser having an emitter-width greater than about 30 μm is often referred to as a wide-emitter diode-laser.

Generally, for a given length of a diode-laser, the greater the stripe (emitter) width, the greater will be the potential output power of the diode-laser. However, the wider the stripe width, the greater is the number of transverse modes at which the laser delivers output radiation. The greater the number of transverse modes, the poorer is the quality of the output beam of the diode-laser. While a multiple transverse mode output beam is acceptable for diode-laser applications such a heating and surface treatment, it is often not suitable for applications in which the output beam must be focused into a small spot, for example in end-pumping a fiber laser. There is a need for a wide-stripe diode-laser that operates in a single transverse mode.

SUMMARY OF THE INVENTION

In one aspect, a diode-laser in accordance with the present invention comprises a lower cladding region, a lower waveguide region, an active region including a quantum-well layer, an upper waveguide region, and an upper cladding region, grown in listed order on a substrate. The substrate, with the regions grown thereon, has two parallel, cleaved facets. The distance between the facets defines the length of the diode laser. An elongated electrode having a length less than the length of the diode-laser is located on the upper cladding region, arranged perpendicular to the facets. The electrode defines a pumped stripe section of the diode-laser. The longitudinal axis of the diode-laser extends through the pumped stripe of the diode-laser. At least one etched area is provided in the upper cladding region of the diode-laser outside the stripe section and aligned with the longitudinal axis. The etched area has a maximum depth less than or equal to the thickness of the upper cladding region, and has a shape and depth profile selected to provide a diverging lens effect for laser radiation circulating in the waveguide-regions.

In one preferred embodiment of the inventive diode laser, the electrode is located between the facets of the diode laser and there is a plurality of the etched areas between each end of the electrode and the corresponding facet. The number shape and depth profile of the etched areas are selected, for a given current passed through the diode-laser via the electrode, such that the diode-laser operates in only a single transverse mode.

BRIEF DESCRIPTION OF THE DRAWINGS

The accompanying drawings, which are incorporated in and constitute a part of the specification, schematically illustrate a preferred embodiment of the present invention, and together with the general description given above and the detailed description of the preferred embodiment given below, serve to explain the principles of the present invention.

DETAILED DESCRIPTION OF THE INVENTION

In developing wide-stripe diode-lasers in accordance with the present invention, it was determined that a significant problem in achieving single mode-operation is a thermally induced phase curvature induced in the waveguide regions due to passage of current through the diode-laser. The phase curvature results from an uneven distribution of temperature across the width, i.e., in the X-axis direction, of the diode-laser.

Figure 2:
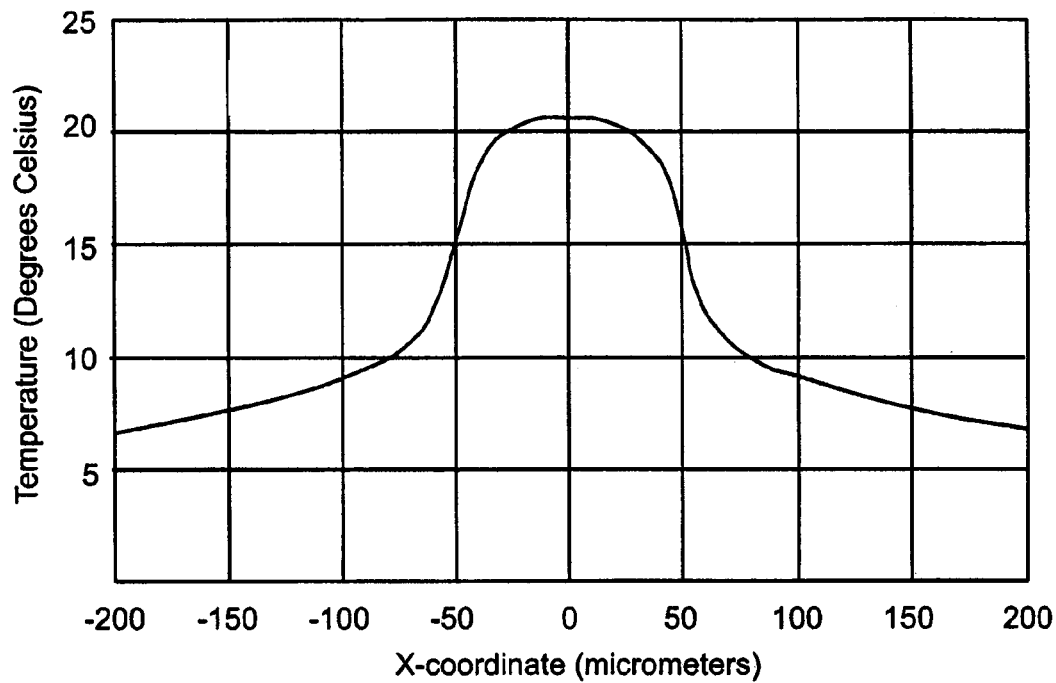
FIG. 2 illustrates computed temperature variation during operation across the width of the diode-laser of FIG. 1.

A computed, exemplary temperature distribution is schematically depicted, graphically in FIG. 2. In this calculated example, it is assumed that the diode-laser is a semiconductor structure indium-soldered to a cooper heat sink, the electrode has a width of 100 µm, and that 4 watts of current are passed through the diode-laser. The temperature peaks in the center (X=0) of the diode-laser, i.e., on the Z-axis. This temperature distribution causes a corresponding refractive index variation across the width of the diode-laser. The refractive index distribution causes a phase curvature in the X-axis for radiation circulating in the waveguide regions of the laser.

Figure 3:
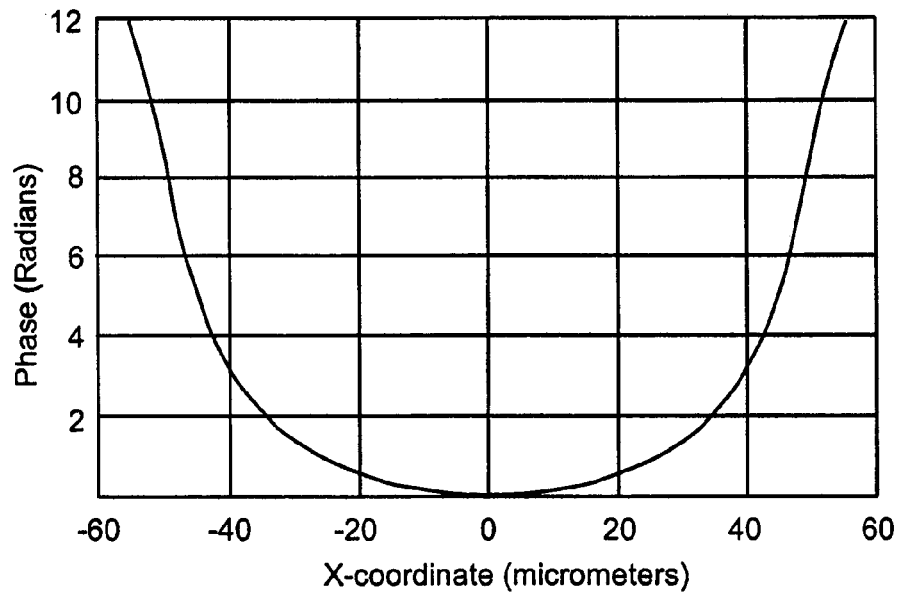
FIG. 3 schematically illustrates computed phase curvature of output radiation resulting from the temperature variation of FIG. 1.

A computed example of this phase curvature as a function of X-axis position is schematically, graphically depicted in FIG. 3. This phase curvature results in a 100-µm length of the laser having a dioptric power of about 0.033 mm$^{-1}$, equivalent to a converging lens with a focal length of about 30.0 mm. Accordingly, the 1.0 mm length of the diode-laser provides the equivalent of a converging lens with a focal length of about 3.0 mm. A result of this thermally induced lens is that the fundamental operating mode of the laser is constrained to a relatively narrow central portion of the total width of the laser (the stripe width). This leaves gain in the remaining portions of the laser width available to support higher order operating modes, i.e., to support multiple transverse mode operation.

In a laser in accordance with the present invention, the laser stripe defined by the electrode has a length less than the total length of the laser. One or more etched features are incorporated in the outer cladding region of the laser, between the ends of the electrode and the ends of the laser, that create a diverging lens effect in the waveguide regions of the laser. As is described in detail further hereinbelow, this diverging lens effect can be optimized to compensate for the thermally induced converging lens effect and cause the fundamental mode to occupy a majority of the width of the laser, sufficient to deprive higher order modes of the gain required to operate. All of the power generated in the wide stripe can then be concentrated into a single operating mode instead of being distributed over a plurality of transverse modes.

Figure 1:
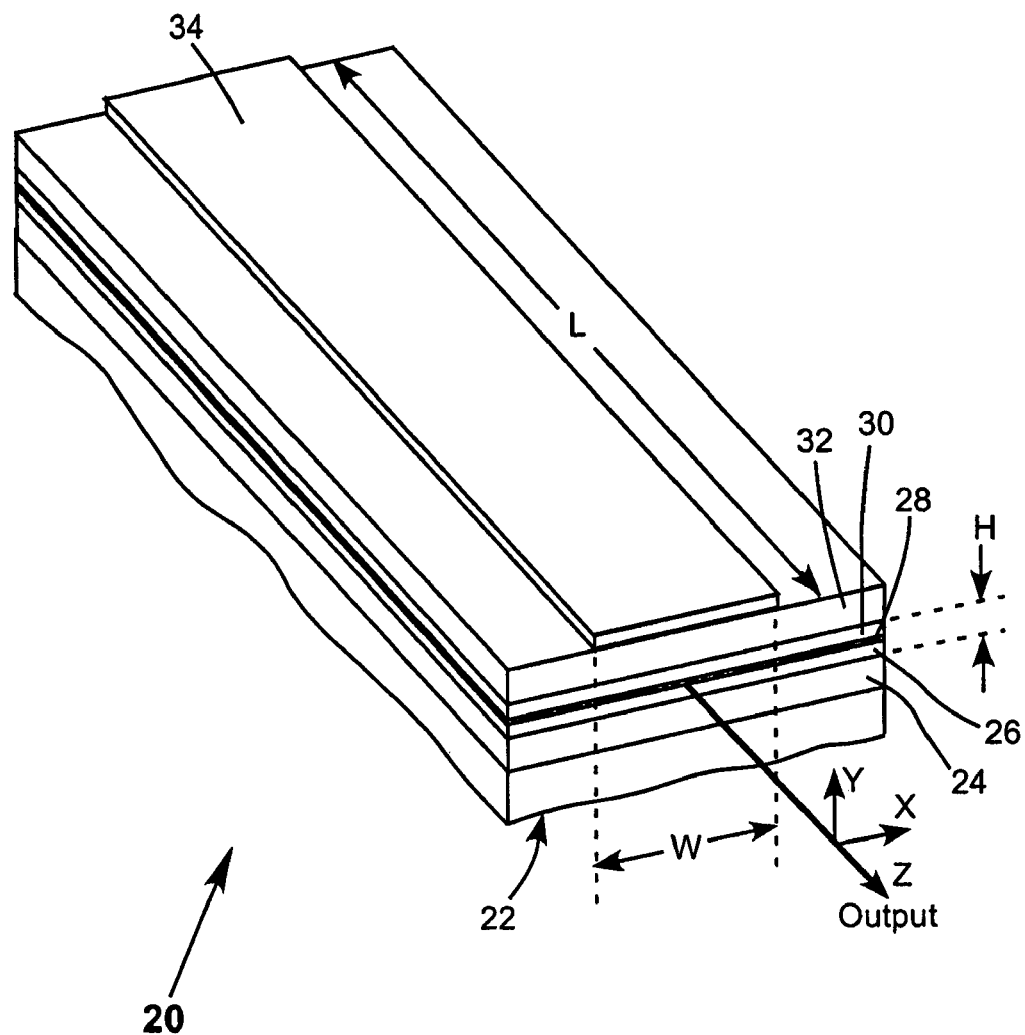
FIG. 1 schematically illustrates details and general dimensions of a prior art separate confinement heterostructure diode-laser including an active region bounded by upper and lower optical confinement regions, the optical confinement regions being bounded by upper and lower electrical confinement regions, and the diode-laser including an elongated rectangular electrode on the upper electrical confinement region for passing an energizing current through the diode-laser, the electrode having a length equal to the length of the diode-laser.
Figure 4:
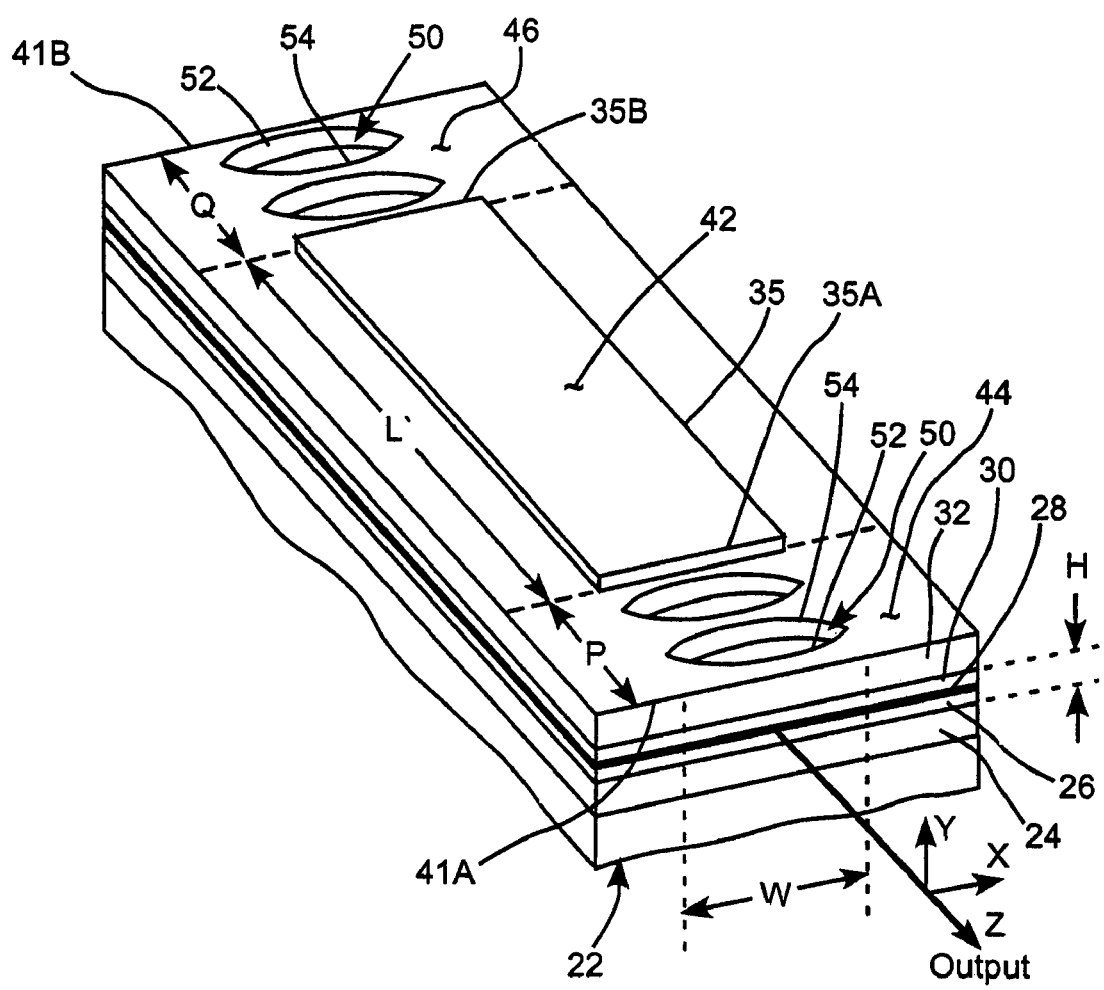
FIG. 4 schematically illustrates a preferred embodiment of a diode-laser in accordance with the present invention having active, optical confinement, and electrical confinement regions similar to those of the laser of FIG. 1, but wherein the elongated rectangular electrode has a length less than the length of the diode-laser, and wherein there are etched areas in the upper electrical confinement region between the ends of the elongated electrode and the ends of the diode-laser for compensating for the phase curvature exemplified in FIG. 3.

FIG. 4 schematically illustrates one preferred embodiment 40 of a diode-laser in accordance with the present invention. Diode-laser 40 includes a substrate 22, upper and lower cladding regions 32 and 24, upper and lower waveguide regions 30 and 26, and an active region 28 similar to corresponding regions of laser 20 of FIG. 1. It is emphasized, here, that the terms upper and lower as used herein refer to the position of regions with respect to substrate 20 being defined as a base, and need not correspond to an instantaneous orientation of the regions in real space.

Each region is depicted as comprising only one layer. This is the case in a simplest form of a separate confinement heterostructure, which is believed to be used in many commercially available diode-lasers. Any of these regions, however, may comprise more than one layer without departing from the sprit and scope of the present invention. A variety of separate confinement heterostructures having cladding, waveguide or active regions including more than one layer are disclosed in U.S. Pat. No. 5,889,805, the complete disclosure of which is hereby incorporated by reference.

In diode-laser 40, an electrode 35 has a length L' less than the total length of the diode-laser. This electrode defines an area 42 (under the electrode) that can be defined as the "pumped" (energized) section of the diode-laser, i.e., the stripe. Electrode 35 preferably is electrically coupled to the cladding and has a length L' between about 0.5 and 1.5 mm. Diode-laser 40 preferably has an emitter-width (stripe-width or electrode width) W greater than about 20.0 µm and more preferable greater than 30.0 µm.

Located between ends 35A and 35B of the electrode and corresponding ends (cleaved facets) 41A and 41B, respectively, of the diode-laser are unpumped (unenergized) sections 44 and 46 respectively. Sections 44 and 46 have lengths Q and P respectively. Q and P may be equal or different.

It is important that in these unpumped sections, at least the quantum well layer or layers of the active region have a disordered structure. The quantum well layer or layers, as epitaxially grown, have a single crystalline structure. This is required in the pumped section or stripe in order that the layer or layers be able to provide optical gain. Outside of the pumped region such layers do not provide optical gain and would, if left in a ordered single crystal form, act as a strong absorber of the laser radiation.

An epitaxial layer system consisting of quantum well layer bounded by waveguide layers represents an inherently unstable material system, in which extremely high gradients in concentration of atomic elements occur over very short distances, i.e. within a few nanometers (nm). The natural rate of exchange of elements (atoms) across the layer interfaces—driven by these concentration gradients—is very low at room temperature, but increases sharply with increasing temperature. The exchange of atoms can be accelerated by the presence of defects in the crystal lattice, such as interstitials and vacancies close to the layer interface. These defects can be introduced by ion implantation of certain atomic species. Ions entering the crystal lattice cause defects in the same, which at high temperatures quickly diffuse toward and through the layer interface, hereby greatly promoting the exchange of constituent elements between the quantum well and waveguide layers. An effect of this atomic exchange, or disordering of the quantum well/waveguide layer system, is to change the bandgap energy as a function of location at the interfaces from a sharp essentially rectangular transition (quantum well) to a smooth transition. This causes the bandgap energy of the quantum well layer (or active region) to increase, thereby rendering the region more transparent to the laser radiation.

In one example of disordering, materials for a 808 nm diode-laser are deposited on a substrate of n-type silicon (a silicon wafer). The diode-laser includes a quantum-well layer of GaAsP is bounded by waveguide layers of InGaP and cladding layers of AlGaInP. Ion implantation is carried out with nitrogen ions having energy levels between about 200 and 400 kilo electron volts (KeV) with the wafer heated to 200° C. during implantation. The heating is important for recovery of the full photoluminescence intensity. The dose of ions is about $1 \times 10^{14}/cm^2$.

The disordering effect is restricted to the unpumped regions of the laser through selective masking areas of the diode-laser where it is intended that the active region retain the original bandgap energy, for example the laser stripe itself. It is preferable to reduce (by etching) the thickness of cladding region 32, in areas to be implanted, to between about 400 and 500 nm to facilitate penetration of ions therethrough. One preferred mask is prepared by first depositing a silicon dioxide ($SiO_2$) layer on the cladding having a thickness of about 250 nm and then depositing a layer of photoresist having a thickness of about 6.0 µm. Following the ion bombardment, the wafer and layers thereon are heated to around 900° C. for 10 minutes to effect the actual disordering. The $SiO_2$ (dielectric material) layer prevents out-diffusion of arsenic (As) atoms. Ion implantation services are commercially available, for example, from Core Systems Incorporated, of Sunnyvale, Calif.

Continuing with reference to FIG. 4, areas 50 in unpumped sections 44 and 46 are etched in upper cladding region 32 to a depth preferably less than the total thickness of the upper cladding region. Etched areas 50, here, have curved walls 52 and 54, providing the areas with an elongated bi-convex shape. Areas 50 are preferably arranged along the Z-axis with the length of the biconvex areas aligned parallel to the X-axis.

Cladding region 32 has a refractive index lower than that of waveguide region 30. It is this refractive index difference at the interface of the two regions that provides the wave guiding or optical confinement property of the waveguide region. In the Y-axis a laser radiation wave propagating in waveguide region has its highest electric field-intensity in the active region. The field intensity reduces towards the interfaces of cladding and waveguide regions; however, the field intensity at the waveguide/cladding interface is not zero, and is finite in the cladding regions close to the interfaces. The phase velocity of the propagating wave is dependent on what can be defined as an effective refractive index in the Y-axis. This effective index is a function of the refractive indices of all of the materials in the active region, the waveguide region and the cladding region. Etching away the cladding region reduces this Y-axis effective refractive index.

Figure 5:
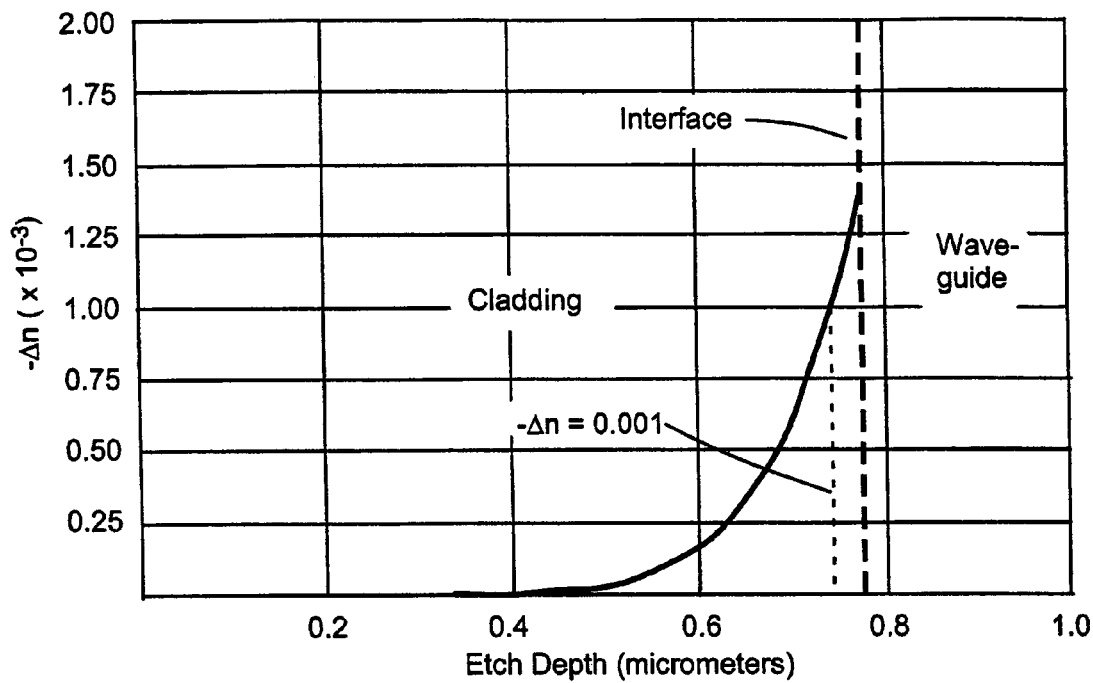
FIG. 5 is a graph schematically illustrating computed reduction of the Y-axis effective refractive index seen by a propagating wave as a function of depth of the etched areas of the diode-laser cladding of FIG. 4.

FIG. 5 graphically depicts the computed reduction (−Δn) of the Y-axis effective index as a function of etch depth in a AlGaInP cladding region, having a refractive index of 3.5. It can be seen that the refractive index reduction does not begin to be apparent until less than about 400 nm of cladding thickness remains. This is because the field does not extend appreciably into the cladding beyond about 200 nm for the waveguide/cladding interface. Accordingly, reducing the thickness of cladding to about 400 nm (to facilitate ion implantation) before etching the etched areas, does not affect the lens-forming effectiveness of etched areas 50.

Refractive index reduction is not significant until less than about 200 nm of cladding thickness remains. This is because, as discussed, above that portion of a wave propagating in the cladding region is close to the interface. A reduction of $1.0 \times 10^{-3}$ is achieved when only about 25 nm of cladding thickness remains. As the etched area is widest at the center of the diode-laser (along the Z-axis) and reduces with distance from the Z-axis, this creates in effect a negative (diverging) "lenslet" (in the X-axis only) for radiation propagating in the unpumped, disordered sections 45 and 46. The total effective diverging power depends on parameters including the etch depth, the number and dimensions of the etched areas, and the refractive index of the material of the cladding layer.

It should be noted here that it is possible, in theory at least, to etch away the upper cladding region entirely. Cladding of an unpumped area is not required to perform any electrical confinement. In practice, however, etching completely to the waveguide region could leave a rough surface on the waveguide region, which would create optical losses. If etching were to "overshoot" into the waveguide region this would create even greater optical losses.

Figure 6:
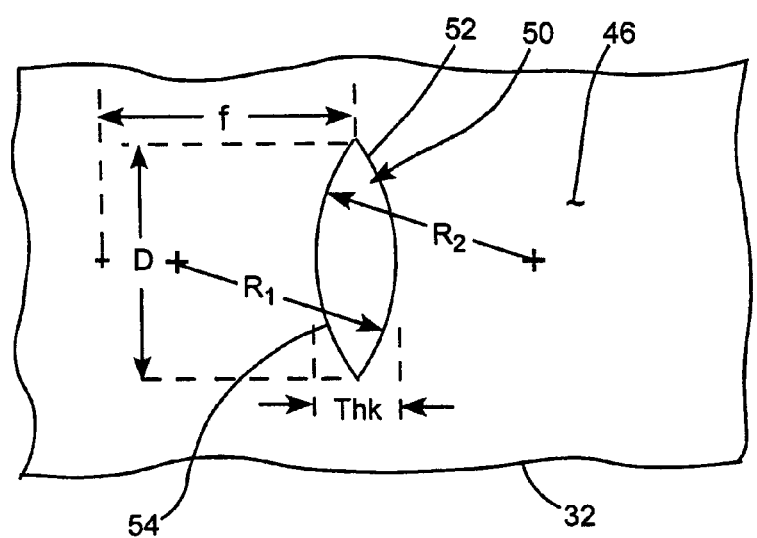
FIG. 6 is a fragmentary plan view of an etched area in the laser of FIG. 4 schematically depicting general dimensions of the etched area.

Referring now to FIG. 6, important dimensions of an etched area 50 are: the radii $R_1$ and $R_2$ of the walls 52; and 54, respectively; the vertex (Z-axis) thickness Thk; and the aperture D, which is preferably equal to and more preferably greater than the width W of electrode 42 (see FIG. 4). The (negative) focal length (f) of the effective lens created can be derived from an equation:

$$1/f = \Delta n/n * 2/R + \Delta n^2/(n(n-\Delta n)) * Thk/R^2 \quad (1)$$

As $\Delta n^2$ is diminishingly small compared with $R^2$, the effective focal length can be approximated as:

$$f \sim n/\Delta n * R/2 \quad (2)$$

By way of example, for a radii $R_1$ and $R_2$ both equal to 50.0 nm, a refractive index (n) of about 3.5, and for Δn=0.001, an etched area 50 would provide a diverging lens having a negative focal length of about 75 mm. Two such etched areas would provide an effective negative dioptric power of about 0.03 mm$^{-1}$ (a negative focal length of about 35 mm). This is about equal to the thermally induced power in the same length of pumped section of the above-presented example.

Those skilled in the art will recognize that a conventional optical element having a biconvex shape would provide positive dioptric power. A reason that the biconvex shape of an area 50 provides negative power is that within the shape the effective refractive index is less than that of the medium outside of the shape. In a conventional optical element the opposite is true. Indeed any shape of etched area 50 that would provide positive dioptric power in a conventional optical element will provide negative dioptric power is the adjacent waveguide region of a laser in accordance with the present invention. Accordingly, it should be noted here that the curvature of walls 52 and 54 of an etched area 50 does not need to be equal, nor does the curvature need to be exactly spherical. The shape of an etched area can be plano-convex. The shape of the etched area may even concave-convex. Other curvatures such as elliptical, parabolic, or hyperbolic, may be used. Where a plurality of etched areas are deployed, one or more thereof may have a different shape from one or more of the others. All of these shapes and combinations may be used without departing from the spirit and scope of the present invention.

Figure 7:
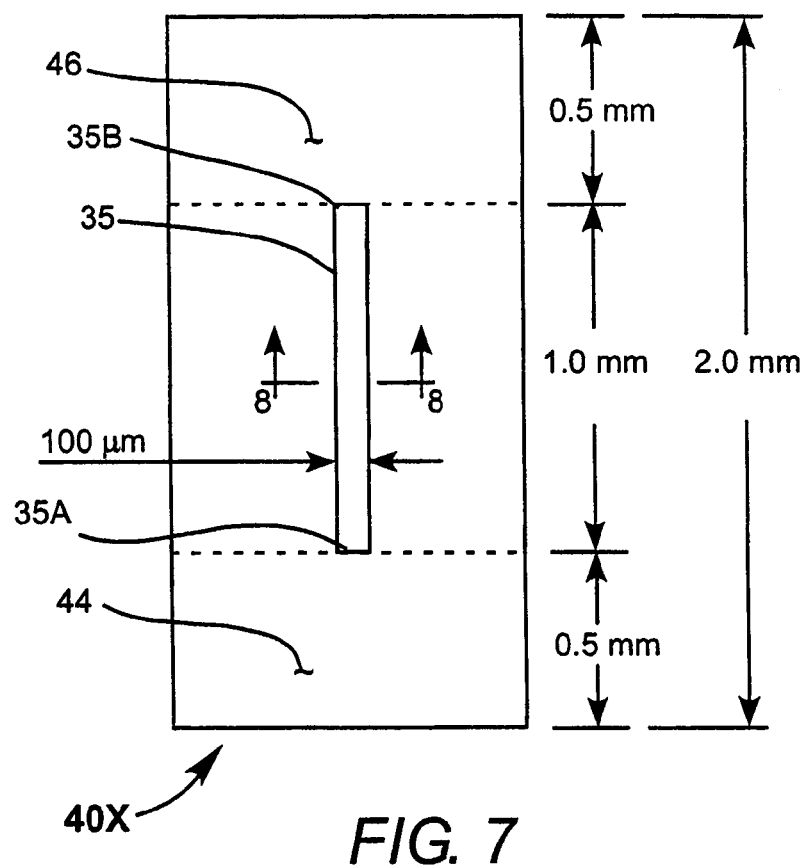
FIG. 7 is a plan view of a diode-laser similar to the diode-laser of FIG. 4 but not having any etched areas in the electrical confinement region.

The effectiveness of the etched areas in causing the fundamental transverse mode to fill the width of inventive diode-lasers having the general arrangement of laser 40 can be estimated by computing the transverse (X-axis) electric field intensity of modes at the mid-length point of pumped section 42 of the diode-lasers. FIG. 7 schematically illustrates one basic arrangement of a diode-laser 40X having a total length of 2.0 mm, an electrode 35 having a length L of 1.0 mm and a width of 100 μm, i.e., a pumped section having a length of 1.0 mm, and unpumped, disordered, sections 44 and 46 each having a length of 0.5 mm. In this arrangement there are no etched areas in the unpumped sections. It is assumed that diode-laser current dissipates about 4.0 W of thermal power.

Figure 8:
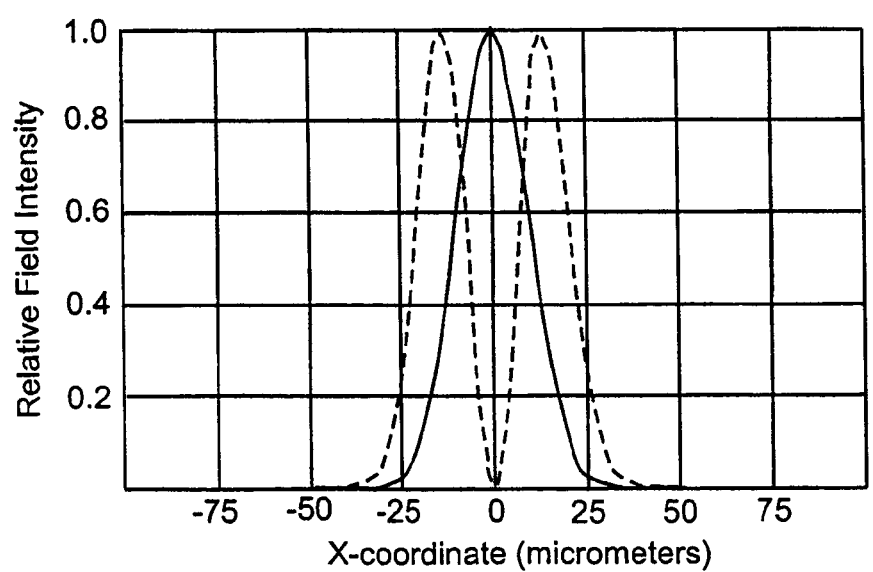
FIG. 8 is a graph schematically depicting computed electric-field intensity for the fundamental mode across the optical confinement region in a plane 8—8 of the diode-laser of FIG. 7 as a function of the transverse coordinate of the diode-laser.

FIG. 8 graphically depicts computed electric field intensity of fundamental (solid curve) and next order (dashed curve) modes at an X-Y plane 8—8 in pumped section 42 of diode-laser 40X. In this example, it is assumed that a current of 4 Watts is passed through pumped section 44 providing the same, positive, dioptric power discussed above with respect to FIG. 3. It can be seen that in the absence, here, of any mechanism to compensate for the above-described thermally induced positive lens effect, the fundamental mode is constrained to a $1/e^2$ width of about 30.0 μm, leaving ample gain volume to support the next and higher order modes.

Figure 9:
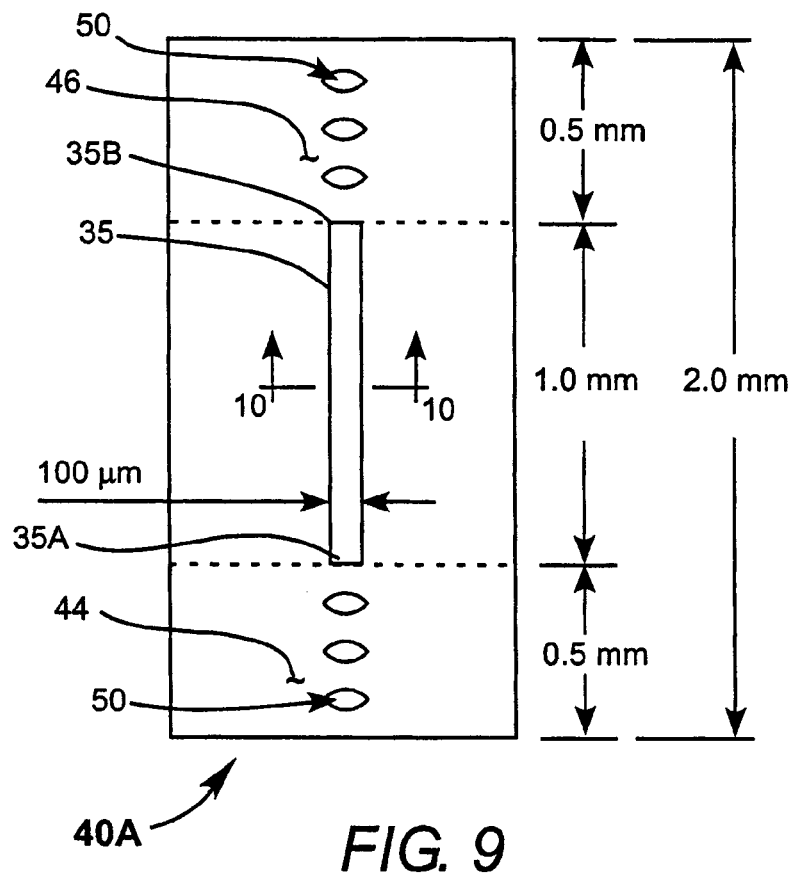
FIG. 9 is a plan view of a diode-laser similar to the diode-laser of FIG. 4 but having three etched areas in the electrical confinement region at each end of the diode-laser.

FIG. 9 schematically illustrates an embodiment 40A of a diode-laser in accordance with the present invention having a total length of 2.0 mm, a pumped section having a length of 1.0 mm and a width of 100 μm, and unpumped, disordered, sections 44 and 46 each having a length of 0.5 mm. In this arrangement there are three etched areas 50 in each of the unpumped sections.

Figure 10:
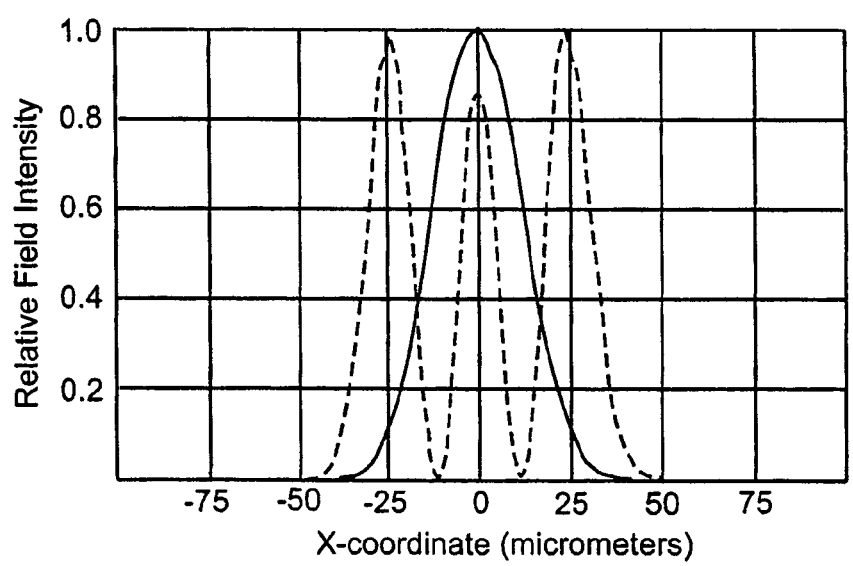
FIG. 10 is a graph schematically depicting computed electric-field intensity for the fundamental mode across the optical confinement region in a plane 10—10 of the diode-laser of FIG. 9 as a function of the transverse coordinate of the diode-laser.

FIG. 10 graphically depicts computed electric field intensity of fundamental (solid curve) and next order (dashed curve) modes at an X-Y plane 10—10 in pumped section 42 of diode-laser 40A. It is assumed that the positive dioptric power in pumped section 42 is the same as that of diode-laser 40X. It is also assumed that each etched area has the same dimensions and provides the same negative dioptric power as discussed above with respect to FIG. 6. Here, the $1/e^2$ fundamental mode (solid curve) width is about 40.0 μm, and the next order mode has three peaks and extends to almost 75% the full width (100 μm) of pumped section 42, leaving less gain available to support higher order modes.

Figure 11:
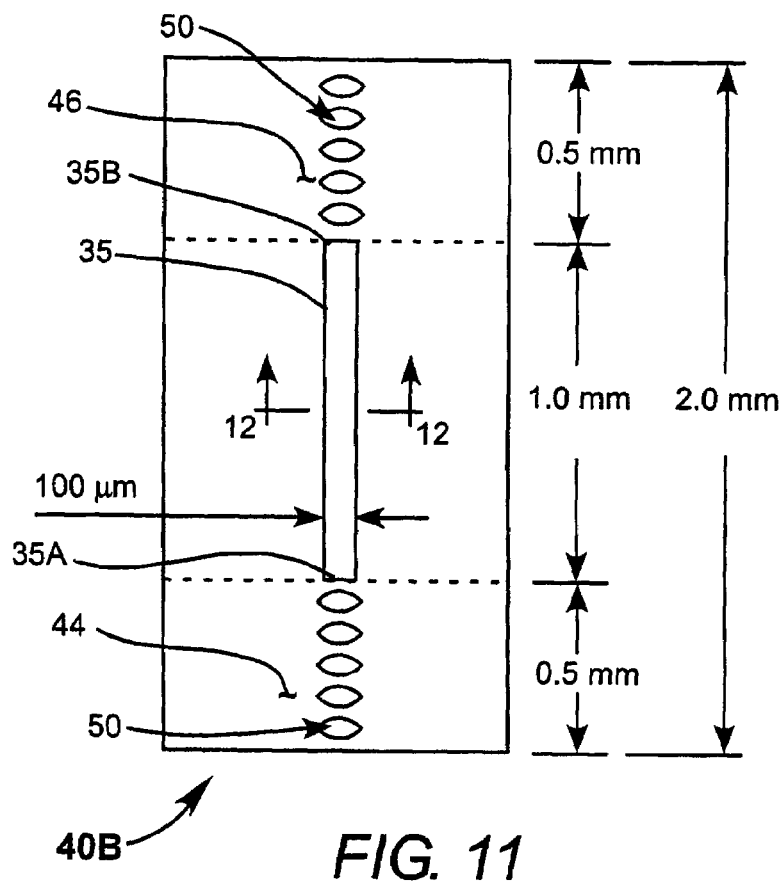
FIG. 11 is a plan view of a diode-laser similar to the diode-laser of FIG. 4 but having five etched areas in the electrical confinement region at each end of the diode-laser.

FIG. 11 schematically illustrates an embodiment 40B of a diode-laser in accordance with the present invention having a total length of 2.0 mm, a pumped section having a length of 1.0 mm and a width of 100 μm, and unpumped, disordered, sections 44 and 46 each having a length of 0.5 mm. In this arrangement there are five etched areas 50 in each of the unpumped sections.

Figure 12:
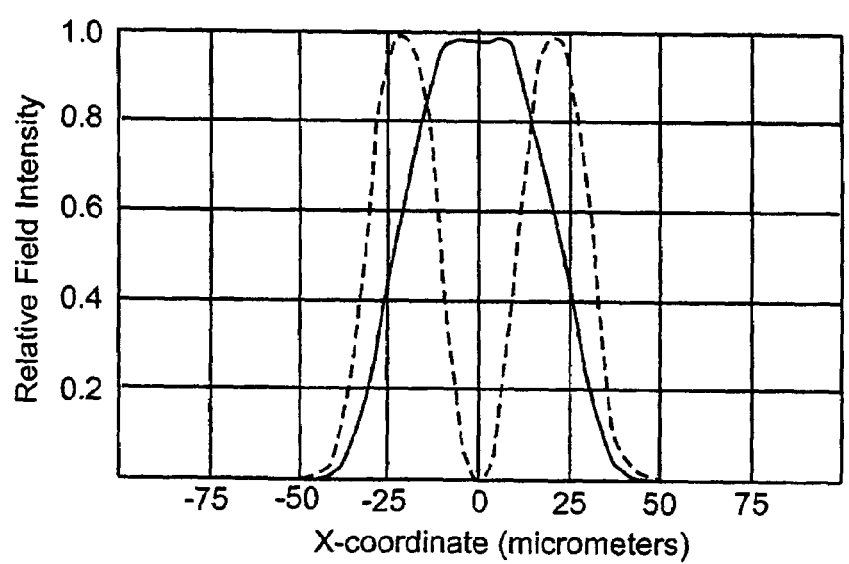
FIG. 12 is a graph schematically depicting computed electric-field intensity of the fundamental mode across the optical confinement region in a plane 12—12 of the diode-laser of FIG. 11 as a function of the transverse coordinate of the diode-laser.

FIG. 12 graphically depicts computed electric field intensity of fundamental (solid curve) and next order (dashed curve) modes at an X-Y plane 12—12 in pumped section 42 of diode-laser 40A. It is assumed that the positive dioptric power in pumped area 42 and the negative dioptric power provided by each etched area 50 are the same as in above-discussed examples. Here the $1/e^2$ fundamental mode (solid curve) width is about 60.0 μm, and the next order mode has two peaks and extends to almost 80% the full width of pumped section 42 leaving insufficient gain available to support higher order modes. Computed losses of the fundamental mode here are only about 10% of the computed losses of the next order mode. Accordingly the fundamental mode will be the only operating mode.

Figure 13:
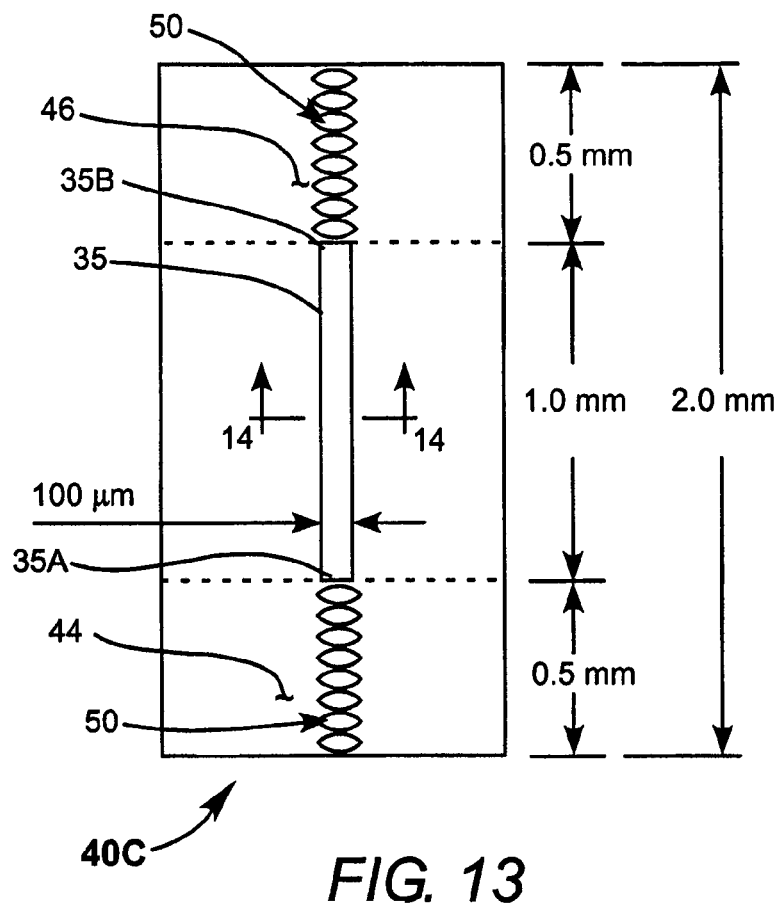
FIG. 13 is a plan view of a diode-laser similar to the diode-laser of FIG. 4 but having eight etched areas in the electrical confinement region at each end of the diode-laser.

As more etched areas are added in unpumped sections 44 and 46, the fundamental mode progressively breaks up and the losses for the fundamental and next order continue to increase. The laser continues to operate in a single transverse mode but the efficiency decreases due to the increased losses. By way of example, FIG. 13 schematically illustrates an embodiment 40C of a diode-laser in accordance with the present invention having a total length of 2.0 mm, a pumped section having a length of 1.0 mm and a width of 100 μm, and unpumped, disordered, sections 44 and 46 each having a length of 0.5 mm. In this arrangement there are eight etched areas 50 in each of the unpumped sections.

Figure 14:
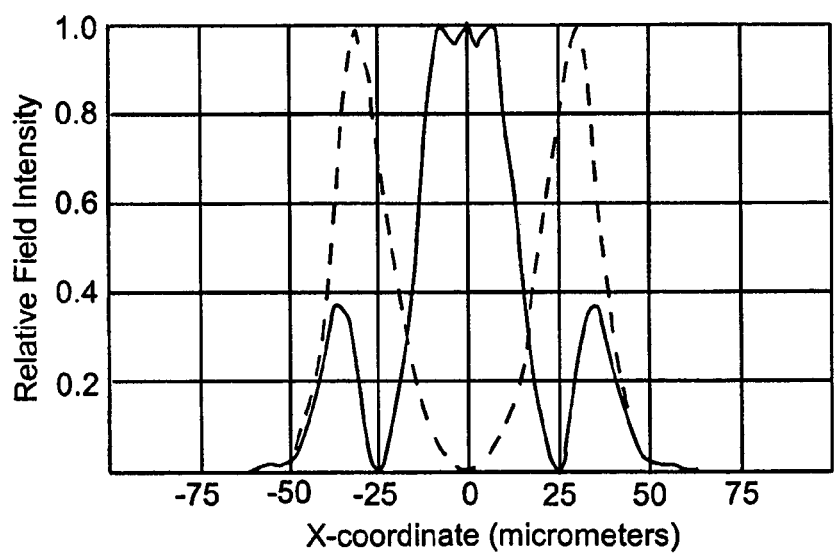
FIG. 14 is a graph schematically depicting computed electric-field intensity of the fundamental mode across the optical confinement region in a plane 14—14 of the diode-laser of FIG. 11 as a function of the transverse coordinate of the diode-laser.
Figure 15:
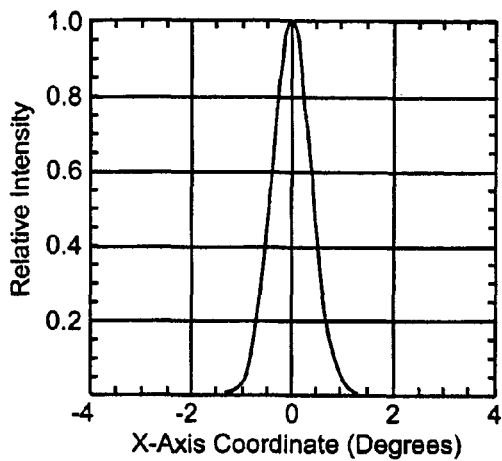
FIG. 15 is a graph schematically illustrating computed far field angular distribution of intensity for the fundamental mode of an output beam of the diode-laser of FIG. 7.
Figure 16:
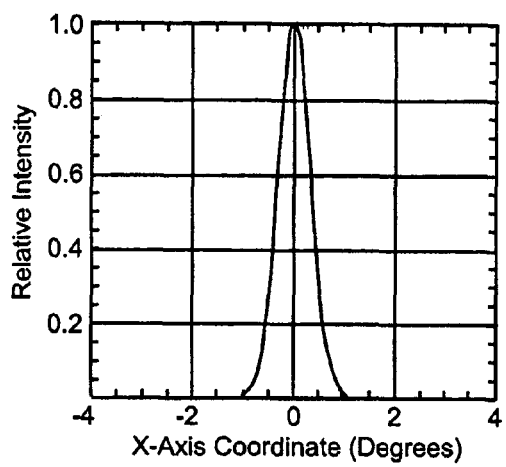
FIG. 16 is a graph schematically depicting computed far field angular distribution of intensity for the fundamental mode of an output beam of the diode-laser of FIG. 9.

FIG. 14 graphically depicts computed electric field intensity of fundamental (solid curve) and next order (dashed curve) modes at an X-Y plane 14—14 in pumped section 42 of diode-laser 40A. Here, the fundamental mode (solid curve) is broken into three peaks 40.0 μm, and the next and the next order mode has three peaks and extends to almost 75% the full width (100 μm) of pumped section 42, leaving less gain available to support higher order modes. The laser here would still operate in a single transverse mode but would operate as an unstable resonator.

Figure 17:
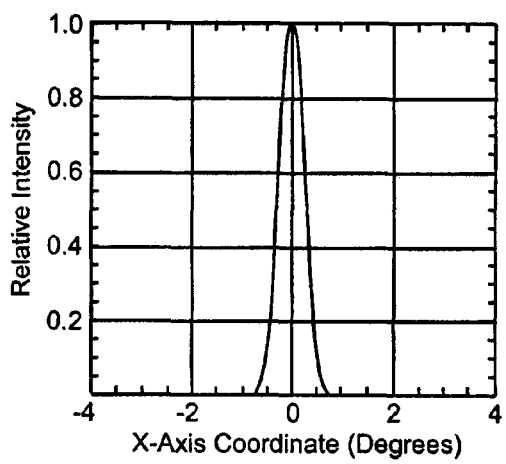
FIG. 17 is a graph schematically depicting computed far field angular distribution of intensity for the fundamental mode of an output beam of the diode-laser of FIG. 11.
Figure 18:
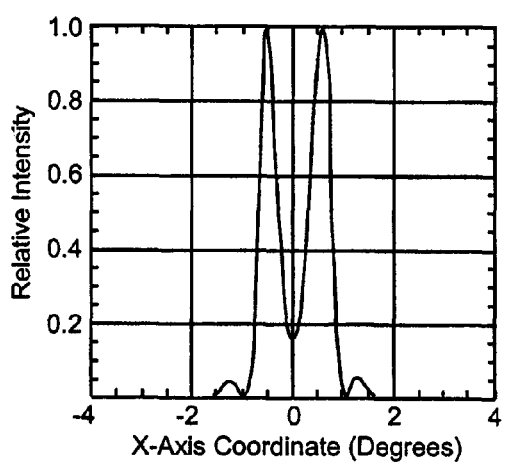
FIG. 18 is a graph schematically depicting computed far field angular distribution of intensity for the fundamental mode of an output beam of the diode-laser of FIG. 13.

FIG. 15, FIG. 16, FIG. 17, and FIG. 18, graphically depict computed far field beam intensity as a function of X-axis (slow axis) angular divergence from the Z axis for the fundamental mode, for the arrangements of lasers 40X (see FIG. 7), 40A (see FIG. 9), 40B (see FIG. 11), and 40C (see FIG. 13), respectively. It can be seen that as up to five etched areas 50 are added in unpumped, disordered regions 44 and 46 the fundamental mode beam divergence is progressively reduced. It should be noticed that in the examples of FIGS. 15 and 16, other modes would be operating that would provide a greater total beam divergence. In the example of FIG. 17, however, only the fundamental mode would be operating and the fundamental mode beam divergence would be the total beam divergence, here, less than ±1°. By way of comparison, a prior-art laser of the type depicted in FIG. 1, having a stripe width 100 μm of would have a total X-axis beam divergence greater than about ±10°.

It should be noted, here that while specific examples of the inventive lasers discussed above are described in the context of diode-lasers having a 100 μm-wide stripe this should not be considered limiting. The present invention is particularly effective for diode-lasers having any stripe width greater than about 30 μm.

Figure 19:
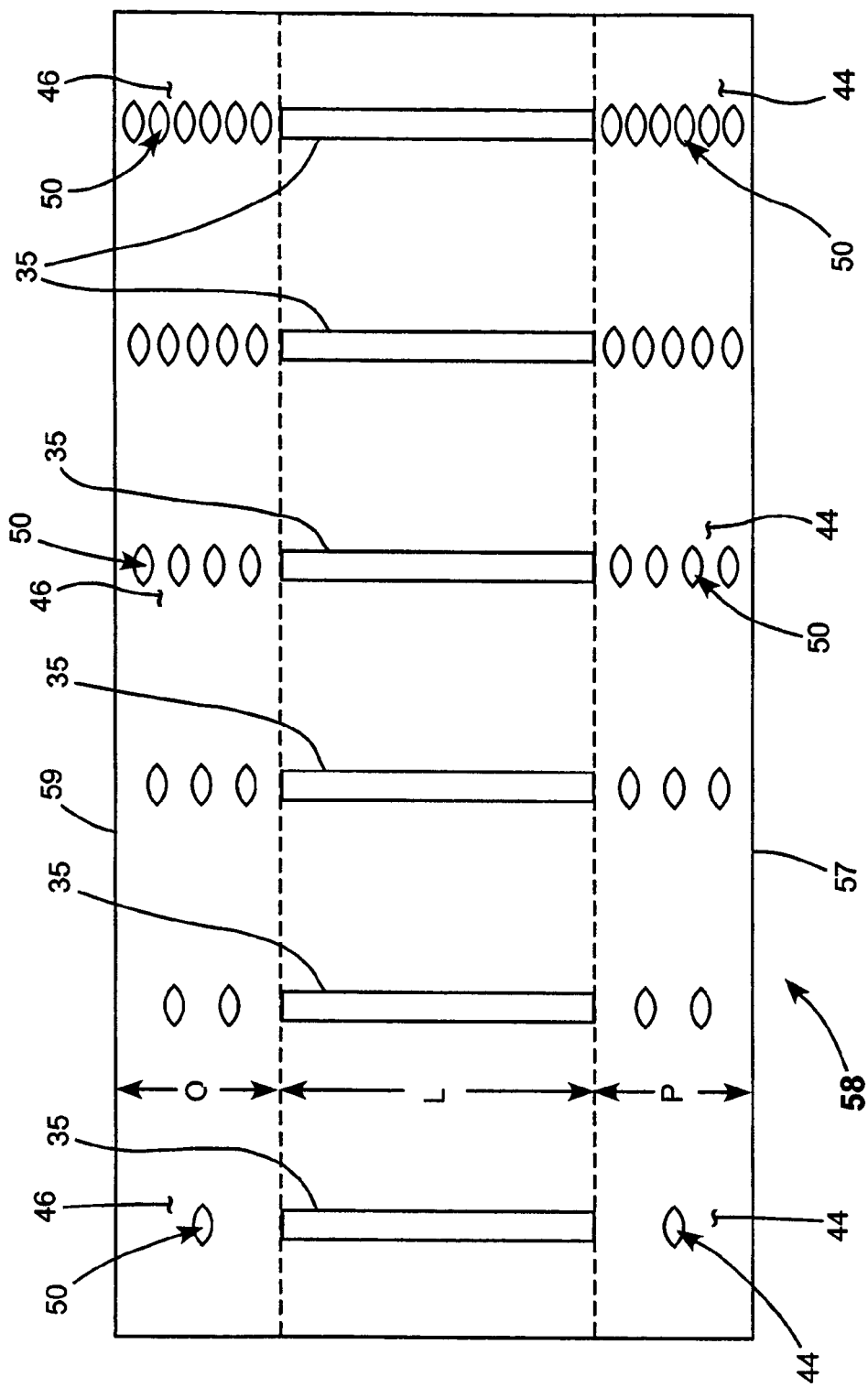
FIG. 19 is a plan view schematically illustrating a plurality of diode-lasers in accordance with the present invention arranged on a single substrate for experimentally optimizing the number of etched areas required to compensate thermally induced phase curvature and provide single mode operation.

Those skilled in the art will recognize from the computations discussed above that for a diode-laser of any given stripe width, electrode length, and operating current there will be an optimum number of etched areas that will achieve the desired single mode operation of the inventive diode-laser. As an alternative to, or an adjunct to determining this optimum number by computation, the determination can be made or verified by a simple experiment. One such is experiment is described below with respect to FIG. 19.

In this experiment, cladding, waveguide and active layers are grown on a chip 58 having sufficient surface area to provide a predetermined amount of lasers, here six. Electrodes 35 are bonded to the chip to define the pumped sections of the diode-lasers. Unpumped sections 46 and 44 are prepared by disordering the quantum-well layer or layers as discussed above. Facets 57 and 59 of the chip are then coated, where necessary, to provide resonator mirrors for the diode-laser. Next, areas 50 are simultaneously etched to provide each diode-laser with a different number of etched areas. In this example, diode-lasers are provided with 1, 2, 3, 4, 5, and 6 etched areas in each of unpumped sections 44 and 46. Each diode-laser can then be evaluated at a predetermined nominal operating current to determine which one or two operate at, or closest to, single transverse mode operation. After selecting one or two candidate devices, the nominal operating current can be varied to optimize single mode operation of each candidate device and allow a final selection to be made.

Figure 20:
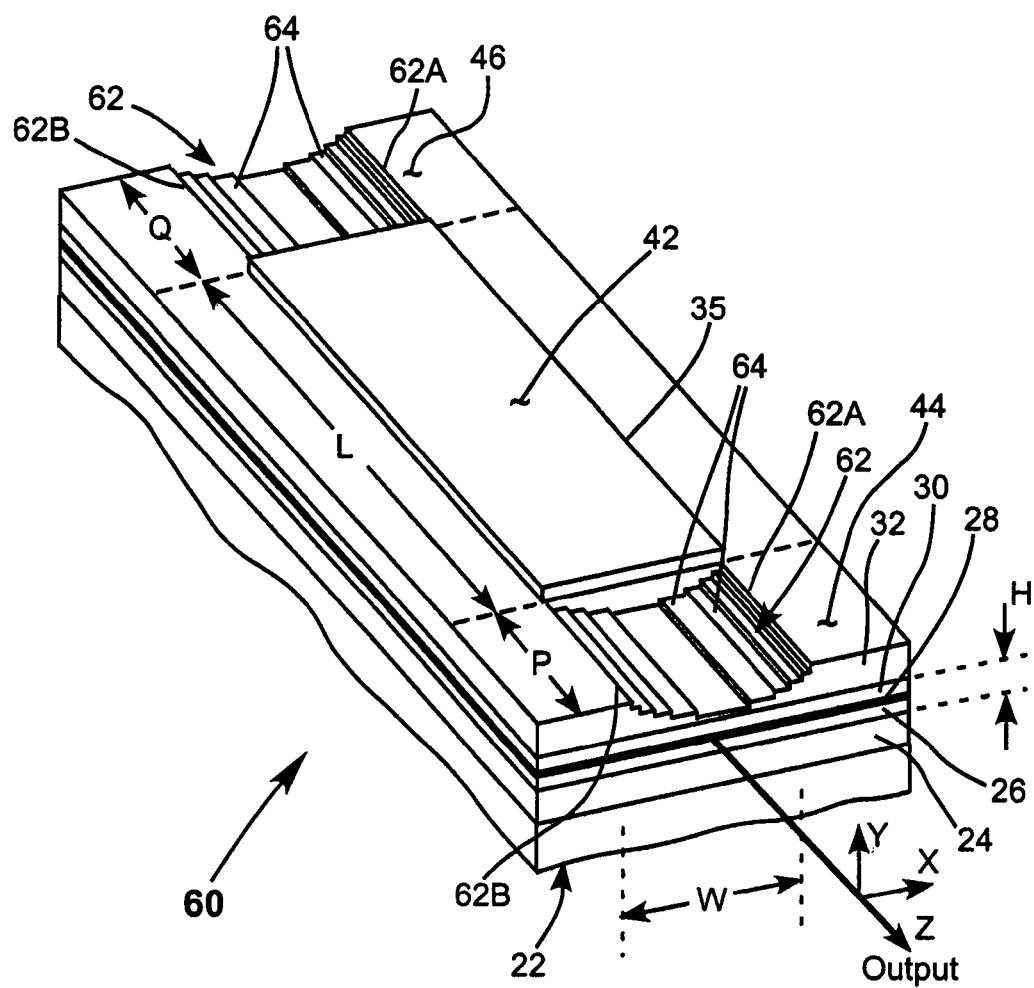
FIG. 20 schematically illustrates another preferred embodiment of a diode-laser in accordance with the present invention similar to the diode-laser of FIG. 4 but wherein the etched biconcave areas of the diode-laser of FIG. 4 are replaced by rectangular etched areas having a transversely graded etch depth.

Referring now to FIG. 20, another embodiment 60 of a diode-laser in accordance with the present invention is similar to the laser of FIG. 4, with an exception that etched areas 50 of the diode-laser are replaced by a rectangular etched area 62. In etched area 62, the etch depth increases transversely, i.e., in the X-axis direction from the edges 62A and 62B of the etched area toward the center. The etched area has a maximum depth on aligned with the Z-axis. Etched area 62 causes the Y-axis effective index to vary along the X-axis, with a lowest value being on the Z axis (at X=0). This causes the waveguide regions below the etched area to act as a stigmatic duct having negative dioptric power. The Z-axis length of the etched area can be varied to vary the total dioptric power. In this example, area 62 has a length equal to the length P of unpumped, disordered section 44. This should not, however, be considered as limiting.

The etch-depth profile can be created by a series of sequential masking and etching operations that create steps 64 having depth and width dimensions selected dependant on a desired effective index profile. The smoother the desired profile, the more etch steps are required. Those skilled in the art will recognize without further illustration that the length of etched area 62 for a selected electrode length, width, and diode-laser current can be optimized by an experiment similar to that described above with respect to FIG. 15 with an exception that different numbers of etched areas 50 are replaced by different lengths of etched area 62. Of course, any single length can be divided into a plurality of lesser lengths.

Clearly, providing etched area 62 is a significantly more complex procedure than providing biconvex etched areas 50 of other embodiments of the inventive laser described above. A potential advantage of etched areas 62 is that they may eliminate backscattering that could occur at etched areas 50.

Several embodiments of diode-lasers in accordance with the present invention are described above in the context of essentially symmetrical arrangements, with a centrally located pumped section or stripe, and with an unpumped section at each of the stripe in which etched areas are located. The inventive diode-lasers are not limited to the above-discussed arrangements having only one stripe but may include asymmetrical arrangements and arrangements including more than one pumped section or stripe.

Figure 21:
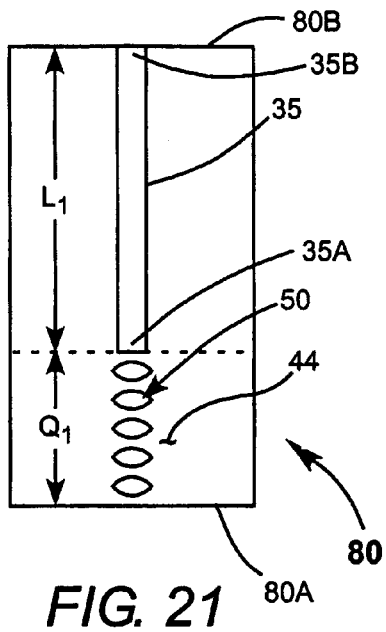
FIG. 21 is a plan view schematically illustrating yet another embodiment of the present invention similar to the laser of FIG. 4, but wherein there are etched areas between only one end of the electrode and a corresponding end of the diode-laser.

By way of example FIG. 21 is a plan view schematically depicting a diode-laser 80 in accordance with the present invention including one electrode 35, having end 35B thereof adjacent end (facet) 80B of the diode-laser. Between end 35A of the electrode and end 80A of the diode-laser is an unpumped disordered section 44 including five etched areas 50. In this arrangement, the fundamental mode would have its widest portion at end 80B and its narrowest portion at end 80A of the diode-laser. In this arrangement it might be preferred to make end 80B of the diode-laser the output end as the wide beam would reduce the possibility of facet damage, the lower reflecting output ends of diode-lasers typically being more susceptible to damage than the maximally reflecting ends.

Figure 22:
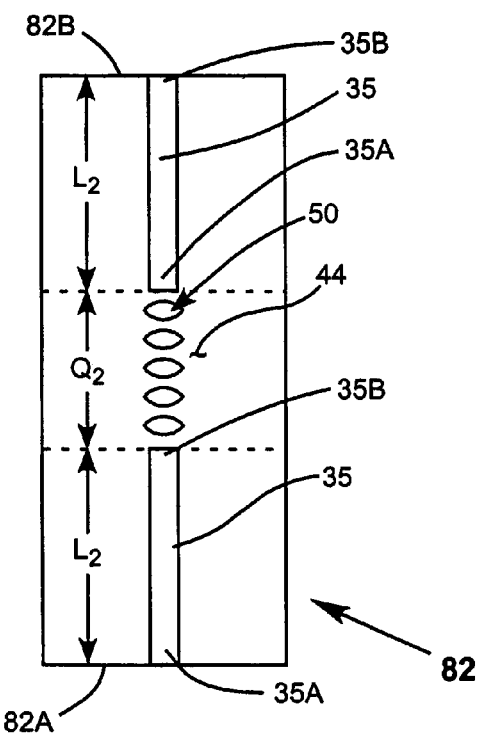
FIG. 22 is a plan view schematically illustrating still yet another embodiment of the present invention similar to the laser of FIG. 21, but wherein there are two electrodes, one at each end of the diode-laser, and etched areas located between the two electrodes.

FIG. 22 is another plan view schematically depicting a diode-laser 82 in accordance with the present invention including two electrodes 35, one having end 35B thereof adjacent end 82B of the diode-laser, and the other having end 35A thereof adjacent end 82A of the diode-laser. Between the electrodes is an unpumped disordered section 44 including five etched areas 50. In this arrangement, the fundamental mode would have widest portions at ends 82A and 82B and its narrowest portion at about the center of unpumped section 44.

Figure 23:
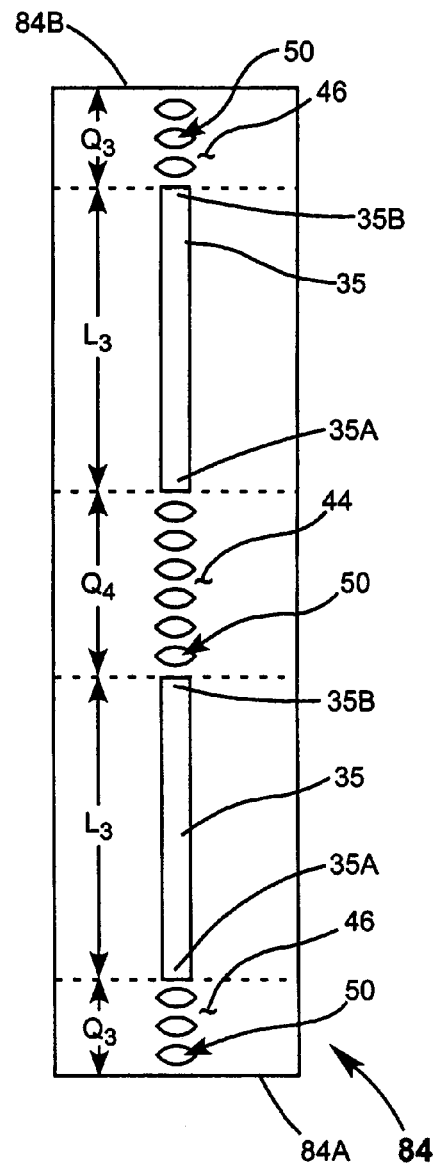
FIG. 23 is a plan view schematically illustrating a further embodiment of the present invention similar to the laser of FIG. 22, but wherein there are two electrodes, etched areas located between the two electrodes, and etched areas between the ends of the electrodes and the ends of the diode-laser.

FIG. 23 is yet another plan view schematically depicting a diode-laser 84 in accordance with the present invention including two electrodes 35. An unpumped, disordered section 46 including three etched areas 50 is located between end 35A of one of the electrodes and end 84A of the diode-laser. Another unpumped, disordered section 46, also including three etched areas 50, is located between end 35B of the other of the electrodes and end 84B of the diode-laser. A third unpumped, disordered section 44 including six etched areas 50 is located between the electrodes. In this arrangement, the fundamental mode would have widest portions at about the mid point of the length of each electrode, and narrowest portions at the ends of the diode-laser and at the center of unpumped disordered section 44. In this arrangement, the fundamental mode would occupy more of the pumped region of the electrodes than would be the case in diode-laser 82 of FIG. 22.

It should be noted here that diode-lasers in accordance with the present invention are not limited to any particular semiconductor material or substrate combination. By way of example, the inventive diode-lasers may be formed from semiconductor-materials/substrate combinations including, but not limited to, InGaAsP/InP InGaAs/GaAs, AlGaAs/GaAs, InGaAsP/GaAs and InGaN/Al$_2$O$_3$, which provide a relatively-broad spectra of fundamental-wavelengths in ranges, respectively, of about 960 to 1800 nanometers (nm); 850 to 1100 nm; 700 to 850 nm; 620 to 700 nm; and 425 to 550 nm. There is, of course, some overlap in the ranges.

The present invention is described above in terms of a preferred and other embodiments. The invention is not limited, however, to the embodiments described and depicted. Rather, the invention is limited only by the claims appended hereto.

What is claimed is:

1. A diode-laser having a midline longitudinal axis, comprising:
   a substrate having two facets, the distance between said facets defining the length of the diode laser;
   a lower cladding region, a lower waveguide region, an active region including a quantum-well layer, an upper waveguide region, and an upper cladding region, formed on said substrate;
   an elongated electrode electrically coupled to said upper cladding region and located between said facets and defining an elongated pumped section of the diode-laser, said electrode having a length less than the length of the diode-laser thereby leaving at least one unpumped section adjacent said diode-laser at a first end of said electrode, the longitudinal axis of the diode-laser extending through said pumped and unpumped sections of the diode-laser, said quantum-well layer having a higher bandgap in said unpumped section than in said pumped section; and
   at least one etched area formed in said upper cladding region of said unpumped section of diode-laser, said etched area aligned on the midline longitudinal axis of the diode-laser, defining a diverging lens structure and having a maximum depth less than or equal to the total thickness of said upper cladding region.

2. The diode-laser of claim 1, wherein said etched area has a biconcave shape and a uniform depth.

3. The diode-laser of claim 1, wherein said electrode is positioned between said facets providing an unpumped section of said diode-laser at each end of said electrode.

4. The diode-laser of claim 3, wherein there is at least one said etched area in said cladding region in each of said unpumped sections.

5. The diode-laser of claim 4, wherein said upper cladding layer in each of said unpumped sections includes the same number of said etched areas.

6. The diode-laser of claim 4, wherein said unpumped sections of said diode-laser are at each end thereof.

7. The diode-laser of claim 1, wherein said electrode is located with one end thereof adjacent a said facet.

8. The diode-laser of claim 7, wherein there is only one said unpumped section located between an opposite end of said electrode and an opposite said facet.

9. The laser of claim 1, wherein said active region, and each of said waveguide, and cladding regions includes at least one layer of a semiconductor material.

10. The laser of claim 1, wherein said electrode has a width greater than about 30 micrometers.

11. The laser of claim 1, wherein said electrode has a length between about 0.5 millimeters and 1.5 millimeters.

12. A diode-laser having a midline longitudinal axis, comprising:
    a substrate;
    a lower cladding region a lower waveguide region, an active region including a quantum-well layer, an upper waveguide region, and an upper cladding region, grown in listed order on said substrate, said substrate and said regions thereon having two, parallel facets, the distance between said facets defining the length of the diode laser;
    an elongated electrode electrically coupled to said upper cladding region and arranged perpendicular to said facets and defining an elongated pumped section of the diode laser, said electrode having a length less than the length of the diode-laser and being situated between said facets in a position such there is an unpumped section adjacent each end of said electrode, the midline longitudinal axis of the diode-laser extending through said pumped and unpumped sections of the diode-laser, and said quantum-well layer having a higher bandgap in said unpumped sections than in said pumped section; and
    at least one etched area in said upper cladding region of each of said unpumped sections of diode-laser said etched area aligned on the midline longitudinal axis of the diode-laser, defining a diverging lens structure and having a maximum depth less than or equal to the total thickness of said upper cladding region.

13. The diode-laser of claim 12, wherein each of said unpumped sections is located between an end of said electrode and a said facet.

14. The diode-laser of claim 13, wherein said upper cladding layer in each of said unpumped sections includes the same number of said etched areas.

15. A diode-laser having a midline longitudinal axis, comprising:
- a substrate having two, parallel facets, the distance between said facets defining the length of the diode laser;
- a lower cladding region a lower waveguide region, an active region including a quantum-well layer, an upper waveguide region, and an upper cladding region, grown in listed order on said substrate;
- an elongated electrode electrically coupled to said upper cladding region arranged perpendicular to said facets and defining an elongated pumped section of the diode laser, said electrode having a length less than the length of the diode-laser thereby leaving at least one unpumped section of said diode-laser at a first end of said electrode, the midline longitudinal axis of the diode-laser extending through said pumped and unpumped sections of the diode-laser, said quantum-well layer having a higher bandgap in said unpumped section than in said pumped section;
- at least one etched area in said upper cladding region of said unpumped section of said diode-laser, said etched area aligned on the midline longitudinal axis of the diode-laser, defining a diverging lens structure and having a maximum depth less than or equal to the total thickness of said upper cladding region; and
- wherein, for a selected current passed through the diode laser via said electrode, the number of said unpumped areas, and the number, shape and depth profiles of said etched areas in said cladding layers in said unpumped areas is selected such that the diode-laser operates in only a single transverse mode.

16. A diode-laser having a midline longitudinal axis, comprising:
- a substrate;
- a lower cladding region, a lower waveguide region, an active region including a quantum-well layer, an upper waveguide region, and an upper cladding region, grown in listed order on said substrate, said substrate and said regions grown thereon having two, parallel facets, the distance between said facets defining the length of the diode laser;
- an elongated electrode having a length less than the length of the diode-laser on said upper cladding region, arranged perpendicular to said facets and defining a pumped stripe of said diode-laser, the midline longitudinal axis of the diode-laser extending through said pumped stripe of the diode-laser; and
- at least one etched area in said upper cladding region of the diode-laser outside said strip section and aligned on said midline longitudinal axis, said at least one etched area having a maximum depth less than or equal to the thickness of said upper cladding region and having a shape and depth profile selected to provide diverging lens effect for laser radiation circulating in said waveguide-regions.

17. The diode-laser of claim 16, wherein said etched area has a uniform depth.

18. A diode-laser comprising:
- a multi-layer structure including at least one cladding layer; and
- an electrode electrically coupled to said cladding layer with at least one end of said electrode being spaced from an end face of the diode laser to define an unpumped section thereof, and wherein said cladding layer includes a recessed area that defines a diverging lens structure and that is aligned in said unpumped area on the midline longitudinal axis and having a configuration which modifies the effective refractive index of the unpumped area in order to improve the mode performance of the laser.

19. A diode-laser as recited in claim 18, wherein said recessed area is formed in an outer cladding layer.

20. A diode-laser as recited in claim 19, wherein said structure includes a quantum well layer wherein the portion of the quantum well layer aligned with the electrode is formed with a single crystalline structure and the portion of the quantum well layer in the unpumped region is a disordered structure.

21. A diode-laser having a longitudinal axis, comprising:
- a substrate having two facets, the distance between said facets defining the length of the diode laser;
- a lower cladding region, a lower waveguide region, an active region including a quantum-well layer, an upper waveguide region, and an upper cladding region, formed on said substrate;
- an elongated electrode electrically coupled to said upper cladding region and located between said facets and defining an elongated pumped section of the diode laser, said electrode having a length less than the length of the diode-laser thereby leaving at least one unpumped section adjacent said diode-laser at a first end of said electrode, the longitudinal axis of the diode-laser extending through said pumped and unpumped sections of the diode-laser, said quantum-well layer having a higher bandgap in said unpumped section than in said pumped section; and
- at least one etched area formed in said upper cladding region of said unpumped section of diode-laser, said etched area aligned on the longitudinal axis of the diode-laser, defining a diverging lens structure and having a maximum depth less than or equal to the total thickness of said upper cladding region; and
- wherein said etched area has a rectangular shape and the depth of said etched area varies in a direction perpendicular to the longitudinal axis of the diode-laser with said maximum depth being on said longitudinal axis.

22. A diode-laser having a longitudinal axis, comprising:
- a substrate having two facets, the distance between said facets defining the length of the diode laser;
- a lower cladding region, a lower waveguide region, an active region including a quantum-well layer, an upper waveguide region, and an upper cladding region, formed on said substrate;
- an elongated electrode electrically coupled to said upper cladding region and located between said facets and defining an elongated pumped section of the diode-laser, said electrode having a length less than the length of the diode-laser thereby leaving at least one unpumped section adjacent said diode-laser at a first end of said electrode, the longitudinal axis of the diode-laser extending through said pumped and unpumped sections of the diode-laser, said quantum-well layer having a higher bandgap in said unpumped section than in said pumped section; and
- at least one etched area formed in said upper cladding region of said unpumped section of diode-laser, said etched area aligned on the longitudinal axis of the diode-laser, defining a diverging lens structure and having a maximum depth less than or equal to the total thickness of said upper cladding region;

wherein said electrode is positioned between said facets providing an unpumped section of said diode-laser at each end of said electrode; and wherein there is at least one said etched area in said cladding region in each of said unpumped sections; and wherein said upper cladding layer in one of said unpumped sections includes a different number of said etched areas than is included in said upper cladding layer in the other of said unpumped sections.

23. A diode-laser having a midline longitudinal axis, comprising:

a substrate;

a lower cladding region, a lower waveguide region, an active region including a quantum-well layer, an upper waveguide region, and an upper cladding region, grown in listed order on said substrate, said substrate and said regions grown thereon having two, parallel facets, the distance between said facets defining the length of the diode laser;

an elongated electrode having a length less than the length of the diode-laser on said upper cladding region, arranged perpendicular to said facets and defining a pumped stripe of said diode-laser, the midline longitudinal axis of the diode-laser extending through said pumped stripe of the diode-laser; and at least one etched area in said upper cladding region of the diode-laser outside said strip section and aligned with said midline longitudinal axis, said at least one etched area having a maximum depth less than or equal to the thickness of said upper cladding region and having a shape and depth profile selected to provide diverging lens effect for laser radiation circulating in said waveguide-regions; and wherein said etched area has a rectangular shape and a uniform depth that varies in a direction perpendicular to said longitudinal axis of the diode-laser, with said maximum depth being on said longitudinal axis.

* * * * *